United States Patent [19]
Bartram et al.

[11] Patent Number: 5,816,274
[45] Date of Patent: Oct. 6, 1998

[54] APPARARTUS FOR CLEANING SEMICONDUCTOR WAFERS

[75] Inventors: Ronald D. Bartram, Webster Groves; Eugene R. Hollander, Wentzville, both of Mo.

[73] Assignee: MEMC Electronic Materials, Inc., St. Peters, Mo.

[21] Appl. No.: 843,632

[22] Filed: Apr. 10, 1997

[51] Int. Cl.⁶ .................................................... B08B 3/04
[52] U.S. Cl. .......................... 134/140; 134/902; 134/147; 134/153; 211/41.18
[58] Field of Search ................................. 134/147, 148, 134/153, 137, 140, 902, 201, 161; 211/41.17, 41.18

[56] References Cited

U.S. PATENT DOCUMENTS

| | | | |
|---|---|---|---|
| 3,964,957 | 6/1976 | Walsh ....................................... | 134/902 |
| 4,325,394 | 4/1982 | Reams ...................................... | 134/902 |
| 4,804,007 | 2/1989 | Bran ......................................... | 134/184 |
| 4,854,337 | 8/1989 | Bunkenburg et al. ................... | 134/184 |
| 4,869,278 | 9/1989 | Bran ......................................... | 134/184 |
| 4,902,350 | 2/1990 | Steck ........................................ | 134/1 |
| 5,071,776 | 12/1991 | Matsushita et al. ..................... | 134/1 X |
| 5,090,432 | 2/1992 | Bran ......................................... | 134/139 |
| 5,134,103 | 7/1992 | Basso et al. ............................. | 134/1 X |
| 5,203,798 | 4/1993 | Watanabe et al. ....................... | 134/184 |
| 5,279,316 | 1/1994 | Miranda .................................. | 134/102.1 |
| 5,286,657 | 2/1994 | Bran ......................................... | 437/9 |
| 5,327,921 | 7/1994 | Mokuo et al. ........................... | 134/182 |
| 5,468,302 | 11/1995 | Thietje ..................................... | 134/1 |
| 5,593,505 | 1/1997 | Erk et al. ................................. | 134/1.3 |

FOREIGN PATENT DOCUMENTS

| | | |
|---|---|---|
| 54-69260 | 4/1979 | Japan . |
| 61-247034 | 11/1986 | Japan ..................................... 134/902 |
| 1-304733 | 12/1989 | Japan ..................................... 134/902 |
| 2-253620 | 10/1990 | Japan ..................................... 134/902 |
| 3-62925 | 3/1991 | Japan ..................................... 134/902 |
| 3-231428 | 10/1991 | Japan ..................................... 134/902 |
| 3-255629 | 11/1991 | Japan ..................................... 134/902 |
| 3-257826 | 11/1991 | Japan . |
| 4-317330 | 11/1992 | Japan ..................................... 134/902 |
| 5-129268 | 5/1993 | Japan ..................................... 134/902 |
| 6-37078 | 2/1994 | Japan ..................................... 134/902 |

OTHER PUBLICATIONS

Cyrus Glickstein, Acoustica Associates, Inc. "Basic Ultra–sonics", Apr. 1960, p. 93.
IBM Technical Disclosure Bulletin vol. 8 No. 12, May 1966.

*Primary Examiner*—Frankie L. Stinson
*Attorney, Agent, or Firm*—Senniger, Powers, Leavitt & Roedel

[57] ABSTRACT

Apparatus for cleaning semiconductor wafers comprises a tank for containing a liquid wherein the liquid has an upper surface. A wafer holder holds the semiconductor wafer in the tank with at least a portion of the semiconductor wafer being immersed in the liquid within the tank. A wafer-moving mechanism is constructed for engaging the semiconductor wafer in the tank to rotate the semiconductor wafer and to reciprocate the semiconductor wafer so that at least a central region of the wafer repeatedly passes through the surface of the liquid. The wafer-moving mechanism comprises first and second surfaces engageable with the semiconductor wafer and rotatable about respective first and second axes of rotation for rotating the wafer.

13 Claims, 8 Drawing Sheets

APPARARTUS FOR CLEANING SEMICONDUCTOR WAFERS

BACKGROUND OF THE INVENTION

This invention relates to cleaning of semiconductor wafers.

Semiconductor wafers for the microelectronics industry are produced by first slicing thin wafers from a crystal ingot. After slicing, the wafers undergo a lapping process to give them a somewhat uniform thickness. The wafers are then etched to remove damage and produce a smooth surface. The final step in a conventional semiconductor wafer shaping process is a polishing step to produce a highly reflective and damage-free surface on at least one face of the semiconductor wafer.

The wafers must be cleaned between the lapping and etching steps to remove contaminants such as lapping grit. If the cleaning process is not effective, the surfaces of the wafer will be stained with fine lapping grit residue. Such residual grit may cause contamination problems during electrical device fabrication. Cleaning of lapped silicon wafers is generally done in ultrasonic tanks using a caustic solution with or without a surfactant to assist in wetting and dispersing dirt. The total processing time to produce sufficiently clean wafers may be thirty or more minutes.

A disadvantage of the duration of the cleaning process is that prolonged exposure to ultrasonics causes damage to the wafers. The extensiveness of the damage increases as the exposure time to the ultrasonics increases. Another disadvantage of the cleaning process duration is delay in providing feedback information to the lapping operator concerning the quality of the lapped wafers (e.g., Total Thickness Variation measurements, presence of scratches, etc.). Such information allows the operator to make any needed corrective adjustments to the lapping process for avoiding damage to additional wafers, but can generally only be provided after the wafers are cleaned. The longer the delay in providing the feedback information, the larger the number of damaged wafers before corrective actions can be taken.

One prior art apparatus for cleaning semiconductor wafers is disclosed in U.S. patent application Ser. No. 08/686,367, which is incorporated herein by reference. This apparatus comprises a tank containing a liquid, means for directing sonic energy through liquid contained in the tank, a wafer holder, and a wafer-moving mechanism. The wafer holder is adapted for holding the semiconductor wafer in a generally upright position within the tank with a central region of the semiconductor wafer being about level with the surface of the liquid contained in the tank. The wafer-moving mechanism is constructed for engaging the semiconductor wafer in the wafer holder to impart a rotating motion to the semiconductor wafer in the tank and to impart a generally up and down reciprocating motion to the semiconductor wafer so that the central region of the wafer repeatedly passes through the surface of the liquid.

This apparatus performs well with wafers produced by current production processes, including wafers that have orientation discontinuities, such as a flat or notch along the periphery of the wafer. However, there have been recent developments in wafer edge grinding which produce extremely smooth peripheral edges. When wafers subjected to fine edge grinding are rotated and agitated in the prior art apparatus, the edges of the wafers tend to slip against the wafer-moving mechanism. If a wafer has a flat, it may stop rotating when the center of the flat rests against the wafer-moving mechanism because there is not enough friction to lift and rotate the wafer off its flat. This results in overexposure of the half of the wafer extending above the surface of the liquid, causing non-uniform cleaning and staining of the wafer.

If the wafer is notched rather than flatted, rotation of the wafer is more erratic and the speed of rotation is lower than for notched wafers produced by standard edge grinding. The erratic rotation and lower rotation speed adversely effects cleaning performance because the wafer is not cycled through the surface of the liquid in the tank as frequently as wafers rotating at a faster speed.

SUMMARY OF THE INVENTION

Among the several objects of this invention may be noted the provision of an improved apparatus for cleaning semiconductor wafers; the provision of such an apparatus which uniformly cleans the wafers; the provision of such an apparatus which minimizes the duration required for cleaning the wafers; the provision of such an apparatus which minimizes the duration the wafers are exposed to ultrasonics; the provision of such an apparatus which maximizes the effectiveness of ultrasonics in the cleaning process; and the provision of such and apparatus which uniformly cleans wafers having very smooth edges as well as wafers having orientation discontinuities.

Generally, apparatus of the present invention for cleaning semiconductor wafers comprises a tank for containing a liquid. A wafer holder holds the semiconductor wafer in the tank with at least a portion of the semiconductor wafer being immersed in the liquid within the tank. A wafer-moving mechanism is constructed for engaging the semiconductor wafer in the tank to rotate the semiconductor wafer and to reciprocate the semiconductor wafer so that at least a central region of the wafer repeatedly passes through the surface of the liquid. The wafer-moving mechanism comprises first and second surfaces engageable with the semiconductor wafer and rotatable about respective first and second axes of rotation for rotating the wafer.

Other objects and features will be in part apparent and in part pointed out hereinafter.

DESCRIPTION OF THE PREFERRED EMBODIMENT

Figure 1:
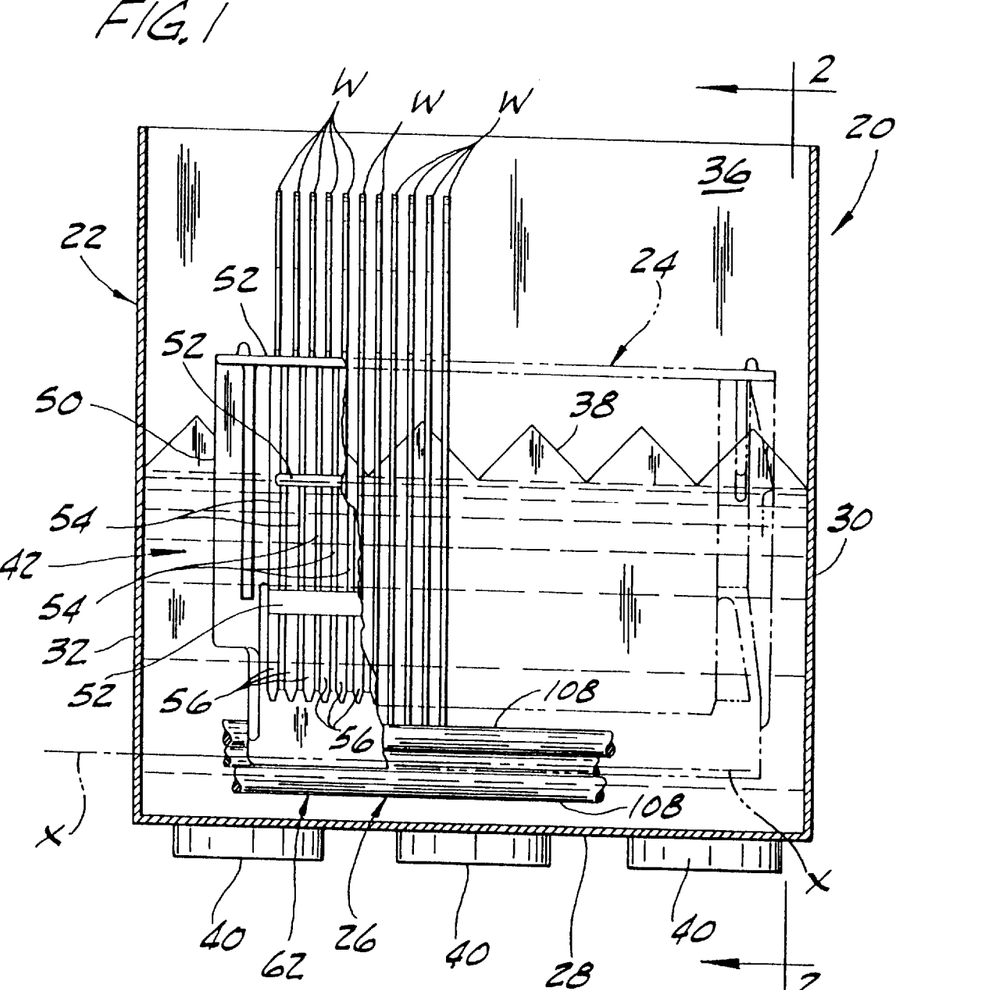
FIG. 1 is a schematic side elevational view of a prior art wafer cleaning apparatus with portions broken away to show detail.
Figure 2:
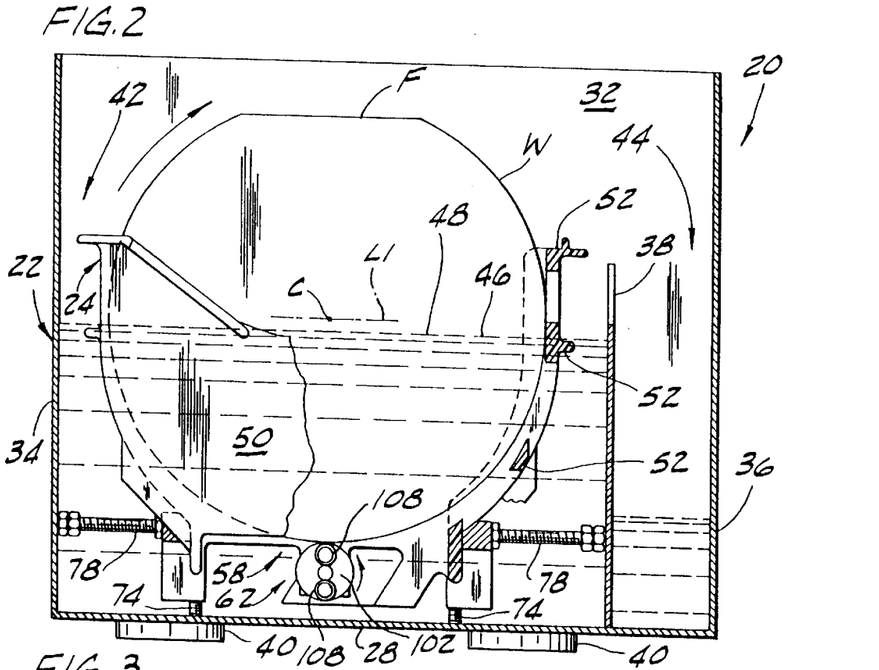
FIG. 2 is a sectional view taken along the plane of line 2—2 of FIG. 1 with portions broken away to show detail.
Figure 3:
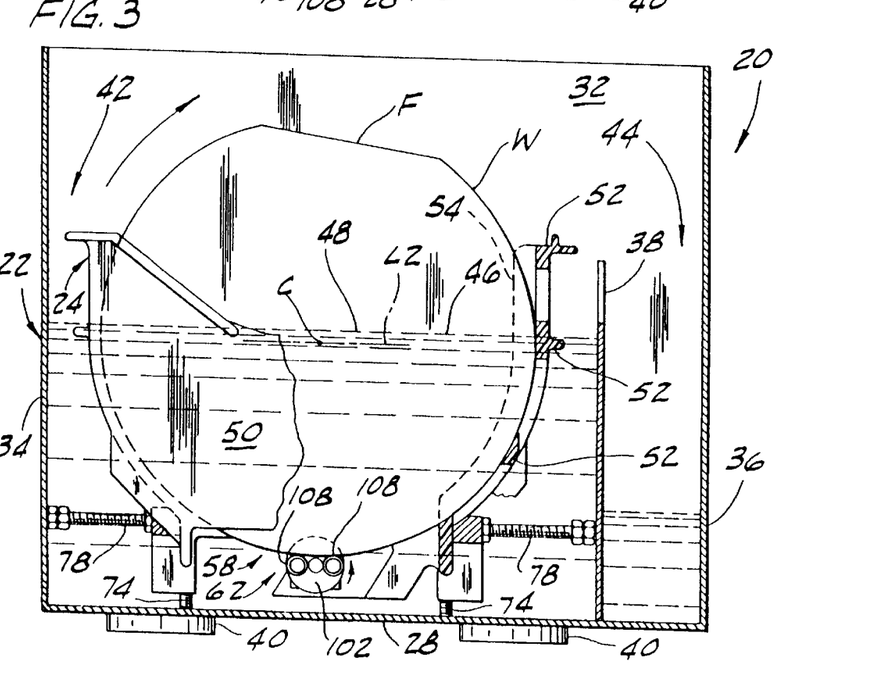
FIG. 3 is a sectional view similar to the view of FIG. 2 but showing a semiconductor wafer rotated clockwise a few degrees and in a lowered position.

Referring now to the drawings, and more particularly to FIGS. 1–3, a prior art apparatus for cleaning semiconductor wafers is indicated in its entirety by the reference numeral 20. This apparatus is disclosed in U.S. patent application Ser. No. 08/686,367, which is incorporated herein by reference. This prior art wafer cleaning apparatus 20 comprises an ultrasonic tank, generally indicated at 22, a cassette, generally indicated at 24, for holding a plurality of semiconductor wafers W, and a wafer-moving mechanism, generally indicated at 26.

It is concluded in the prior art that cleaning of semiconductor wafers in an ultrasonic tank is most effective at the surface of the liquid in the tank, i.e., at the gas-liquid-interface. In other words, ultrasonic energy will clean a portion of a semiconductor wafer located at or just slightly below the gas-liquid-interface at a faster rate than it will clean a portion of the semiconductor wafer well below the gas-liquid-interface. The principal of operation of the wafer-cleaning apparatus 20 is based on this conclusion.

The tank 22 comprises a generally horizontal bottom 28, a front wall 30, a back wall 32, two side walls 34, 36 extending between the front and back walls, a weir 38 generally parallel to the front and back walls and extending between the side walls, and a plurality of ultrasonic or megasonic transducers 40 (shown schematically in FIGS. 1–3) attached to the underside of the bottom. The front wall 30, weir 38, side walls 34, 36, and bottom 28 define a bath, generally indicated at 42, for holding a suitable cleaning liquid. Preferably, the cleaning liquid is a solution of 2% by volume concentrated KOH (45 wt %) and 2% by volume of a commercially available detergent (e.g., Vector HTC, available from Intersurface Dynamics of Bethel, Conn.). Also preferably, the bath temperature is about 60° C. during cleaning of the wafers. The megasonic transducers 40 constitute means for directing sonic energy through liquid contained in the bath 42. The weir 38, back wall 32, side walls 34, 36, and bottom 28 define an overflow receptacle, generally indicated at 44 in FIGS. 2 and 3. The liquid is preferably introduced into the bath 42 via an inlet port (not shown) in the bottom 28 of the tank 22, fills the bath 42, and flows over the weir 38 into the overflow receptacle 44. As long as liquid is being introduced into the bath 42, the weir maintains the liquid in the bath at a constant level. In other words, the gas-liquid-interface, indicated at 46, is maintained at a constant level 48. The overflow receptacle 44 has a drain (not shown) for draining liquid therefrom. The tank 22 is preferably a conventional ultrasonic tank, such as a model XHT-1014-6 ultrasonic tank commercially available from Crest Ultrasonics of Trenton, N.J., but with the weir lowered to lower the liquid level in the bath. Preferably, the ultrasonic tank 22 further includes a circulatory system (not shown) for filtering and recirculating the drained liquid back into the bath 42.

The cassette 24 constitutes a wafer holder for holding the semiconductor wafers W generally upright within the bath 22. Preferably, the cassette 24 is a conventional cassette, such as a model X4200-01 cassette, commercially available from Empak of Colorado Springs, Colo. The cassette 24 has end walls 50, a plurality of horizontal stringers 52 extending between the end walls, and a plurality of upright ribs 54 connected to and spaced at generally equal intervals along the stringers. The spaced upright ribs 54 define wafer receiving slots 56 (FIG. 1). The stringers 52 are adapted to engage the periphery of the semiconductor wafers W to limit lateral movement of the wafers (i.e., left and right movement of the wafers as viewed in FIGS. 2 and 3) when the wafers are received in the wafer receiving slots 56. The ribs 54 are adapted to engage the edge margins of faces of the semiconductor wafers W to limit longitudinal motion of the wafers (i.e., left and right movement of the wafers as viewed in FIG. 1) The cassette 24 preferably has an open bottom 58 (FIGS. 2 and 3) through which the wafers may contact the wafer-moving mechanism 26.

Figure 4:
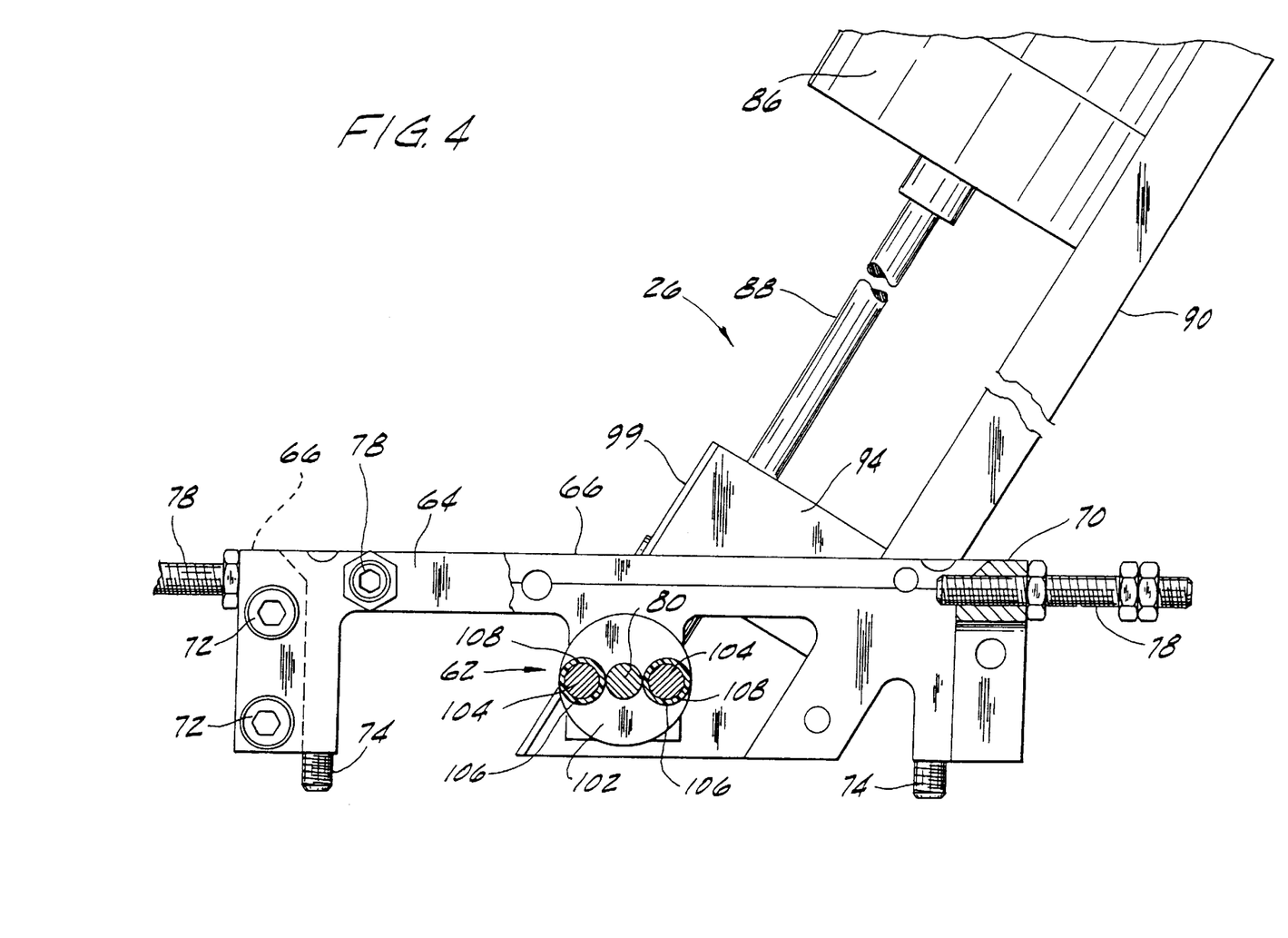
FIG. 4 is an enlarged front elevational view of a wafer moving mechanism of the prior art apparatus.
Figure 5:
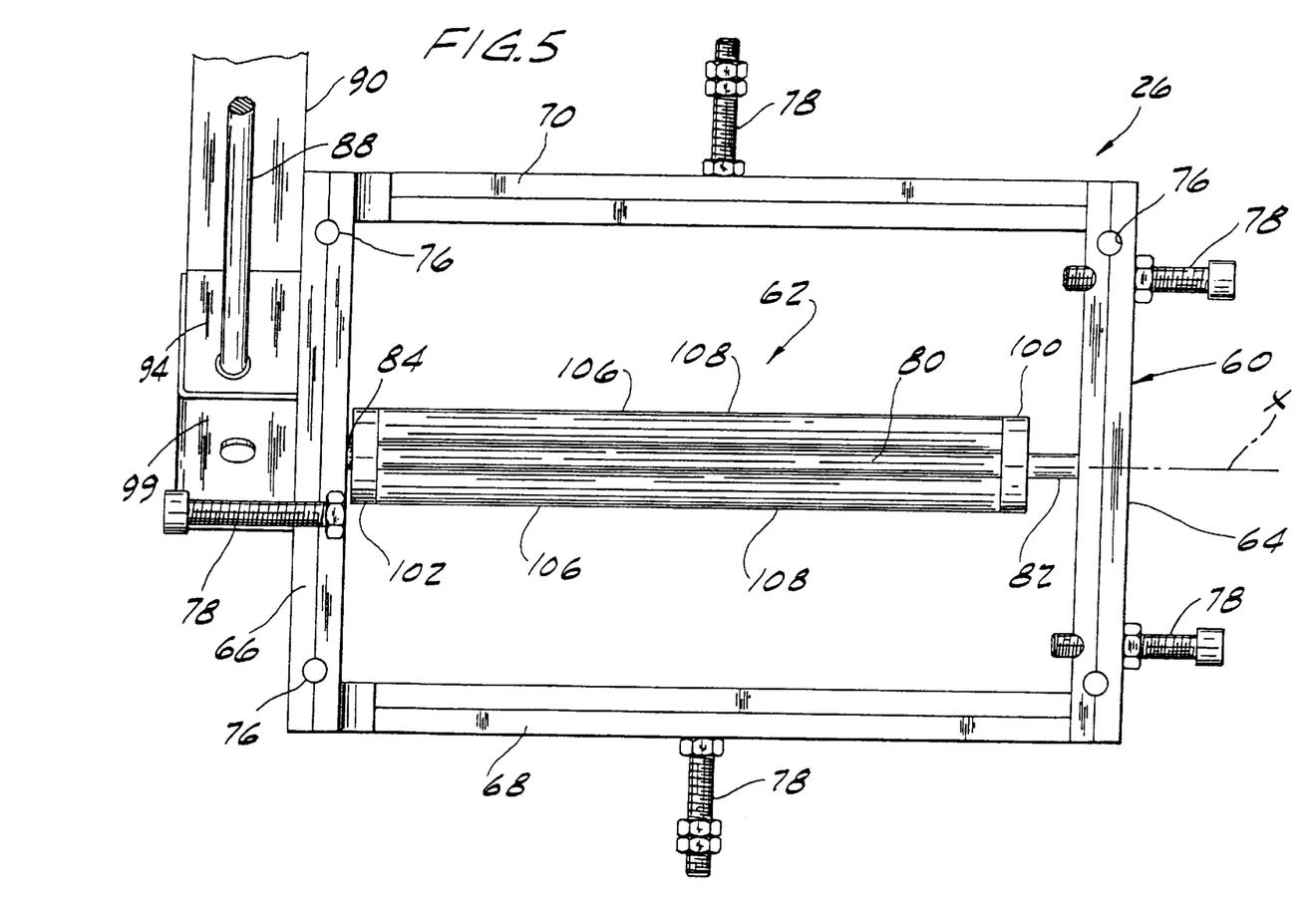
FIG. 5 is a top plan view of the prior art wafer moving mechanism.
Figure 6:
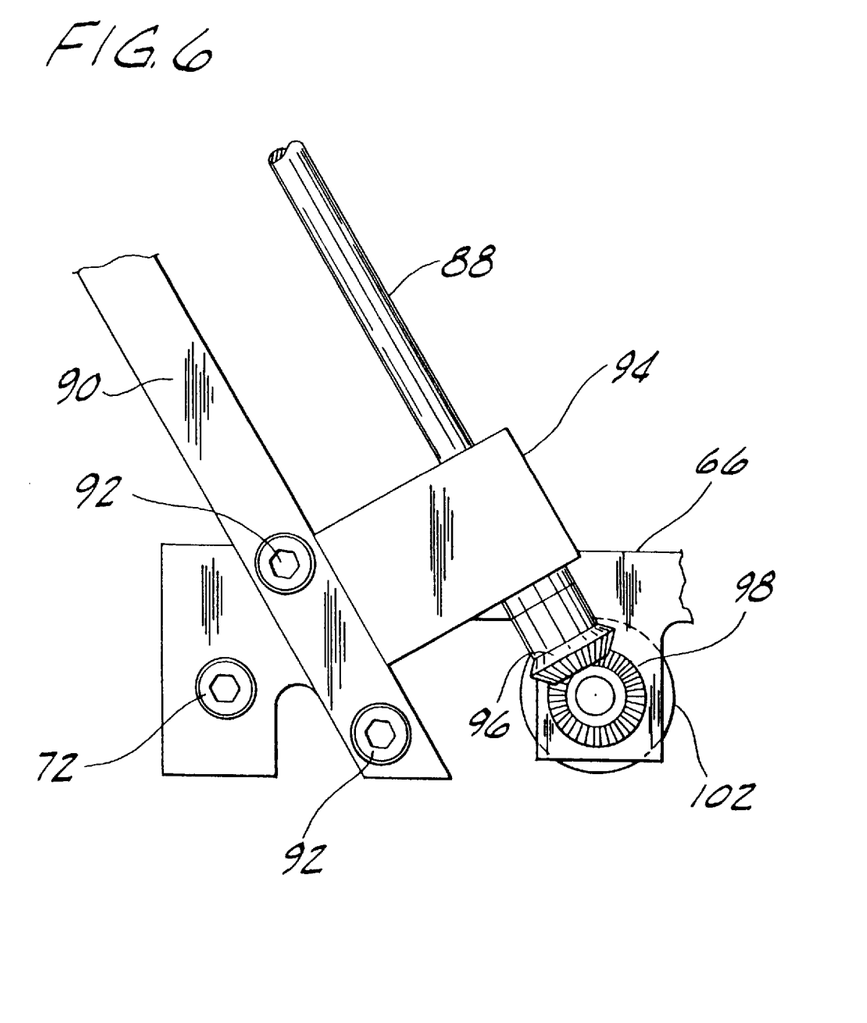
FIG. 6 is a partial rear elevational view of the prior art wafer moving mechanism.

Referring now to FIGS. 4–6, the prior art wafer-moving mechanism 26 has a generally rectangular cassette receiving platform, generally indicated at 60, and a camming mechanism, generally indicated at 62. The cassette receiving platform 60 is preferably of stainless steel and comprises an elongate front member 64, an elongate rear member 66, and two elongate side members 68, 70. The front and rear members 64, 66 are secured to ends of the side members 68, 70 by suitable screws 72 (only two of which are shown in FIG. 4). Preferably, upper edges of the members 64, 66, 68, 70 are beveled to receive the cassette 24. Feet 74 extend downwardly from the front and rear members 64, 66 to engage the bottom 28 of the tank 22 and thereby elevate and level the platform 60 above the bottom. Preferably, the feet 74 comprise screws threaded in vertical holes 76 (FIG. 5) through the front and rear members 64, 66. Turning of the screws 74 in the holes 76 adjusts the elevation of the cassette receiving platform 60 in the bath 42. Horizontally extending screws 78, threaded through the members 64, 66, 68, 70 of the cassette receiving platform 60, extend outward from the platform and press against the inner surfaces of the walls of the bath 42 to secure the wafer-moving mechanism 26 to the tank 22.

The camming mechanism 62 includes a driven shaft 80 extending along a generally horizontal axis X (FIGS. 1 and 5) between the front and rear members 64, 66 of the cassette receiving platform 60. A forward end 82 of the driven shaft 80 is journaled via a suitable bushing (not shown) in the front member 64. A rear end 84 of the driven shaft 80 extends through the rear member 66 and is journaled therein via a suitable bushing (not shown). Preferably, the driven shaft 80 is rotated by a suitable motor 86 (FIG. 4) having a shaft 88 which is generally perpendicular to the axis of the driven shaft. The motor 86 is secured to an elongate motor support 90 extending generally upward from and secured via screws 92 (FIG. 6) to the rear member 66 of the cassette receiving platform 60. Preferably, the motor shaft 88 and motor support 90 extend upward beyond the level of liquid in the bath 42 to keep the motor above the liquid. The lower end of the motor shaft 88 is journaled in and supported by a suitable bearing block 94. A drive bevel gear 96 (FIG. 6) keyed to a lower end of the motor shaft 88 meshes with a driven bevel gear 98 keyed to the rear end 84 of the driven shaft 80. Preferably, a suitable cover 99 (shown in FIG. 5, but removed in FIG. 6) is secured to the bearing block 94 and covers the gears 96, 98. Rotation of the motor shaft 88 rotates the driven shaft 80 about the axis X.

The camming mechanism 62 further includes forward and rear disc-shaped blocks 100, 102, respectively. The forward disc-shaped block 100 is keyed to the driven shaft 80 generally adjacent the front member 64 of the cassette receiving platform 60. The rear disc-shaped block 102 is keyed to the driven shaft 80 generally adjacent the rear member 66 of the cassette receiving platform 60. Two elongate rods 104 (FIG. 4) extend between the disc-shaped blocks 100, 102 generally parallel to the driven shaft 80. The ends of the rods 104 extend into holes (not shown) in the disc-shaped blocks. Preferably, tubes 106 of a suitable elastomeric material (e.g., Tygon®) surround the rods 104 and extend from the forward disc-shaped block 100 to the rear disc-shaped block 102. As described in greater detail below, the outer surfaces of the tubes 106 constitute camming surfaces 108 engageable with the periphery of each semiconductor wafers W. As shown in FIG. 4, the rods 104 are preferably positioned closely adjacent the driven shaft 80 so that the tubes 106 frictionally engage the shaft to prevent rotation of the tubes relative to the shaft. Thus, the disc-shaped blocks 100 and 102, rods 104, and tubes 106 rotate with the driven shaft 80. The tubes 106 are preferably sized and arranged such that when the edge of the wafer is in contact with the camming surface, the wafer edge does not touch the driven shaft 80 at any rotational position of the camming mechanism.

Referring to FIGS. 1–3, when the cassette 24 (with semiconductor wafers W held therein) is inserted in the bath 42 and placed on the cassette receiving platform 60, then bottom portions of the peripheries of the semiconductor wafers contact the camming surfaces 108 (i.e., the outer surfaces of the tubes 106). Since the camming surfaces 108 rotate with the driven shaft 80, rotation of the camming mechanism 62 causes the camming surfaces to revolve around (i.e., orbit) the axis X. The orbiting of the camming surfaces 108 causes the wafers W to reciprocate up and down between a raised position (shown in FIG. 2) and a lowered position (shown in FIG. 3). The camming surfaces 108 also frictionally engage the peripheries of the semiconductor wafers W to cause the wafers to roll on the camming surfaces and thereby counter-rotate relative to the rotation of the driven shaft 80. In other words, counter-clockwise rotation of the camming mechanism 62 (as viewed in FIGS. 2 and 3) and its associated camming surfaces 108 causes clockwise rotation of the semiconductor wafers. Thus, the orbiting of the camming surfaces 108 about the axis X simultaneously imparts an up and down reciprocating motion to and rotates the wafers W.

As discussed above, the weir 38 determines the level 48 of the gas-liquid-interface 46 in the bath 42. The cassette receiving platform 60 is vertically positioned within the bath 42 relative to the weir 38 such that centers C (FIGS. 2 and 3) of the semiconductor wafers W are at an upper level $L_1$ (FIG. 2) above the gas-liquid-interface 46 when the wafers are in their raised position and at a lower level $L_2$ (FIG. 3) below the gas-liquid-interface 46 when the wafers are in their lowered position. Preferably, the weir 38 and level of the platform 60 are selected so that the level 48 of the gas-liquid-interface 46 is generally midway between the upper level $L_1$ and the lower level $L_2$. Thus, the centers C of the semiconductor wafers W pass through the gas-liquid-interface 46 each time the wafers are raised or lowered.

In operation, semiconductor wafers W to be cleaned are placed upright in the cassette 24 within the wafer receiving slots 56. The cassette 24 and wafers W are then picked up (either manually or via a robot arm (not shown)) and placed in the bath 42 on the cassette receiving platform 60. With the cassette 24 positioned on the cassette receiving platform 60, at least one of the two camming surfaces 108 engages the edge of each semiconductor wafer W. Operation of the motor 86 rotates the camming mechanism 62 about the axis X to simultaneously reciprocate and rotate the semiconductor wafers W. The reciprocation action causes the center C of each semiconductor wafer W to move up and down between the upper level $L_1$ (FIG. 2) and the lower level $L_2$ (FIG. 3). The level 48 of cleaning liquid in the bath 42 is selected to be generally midway between the upper and lower levels $L_1$, $L_2$ when the cassette 24 is positioned on the cassette receiving platform 60 and the semiconductor wafers W are being reciprocated and rotated by the camming mechanism 62.

As the position of each semiconductor wafer W is varied (i.e., as the semiconductor wafer is reciprocated and rotated), sonic energy is directed through the cleaning liquid by the transducers 40 to sonically clean the wafers. Preferably, the transducers 40 emit sonic energy in the range of 38 to 42 Khz. As explained above, cleaning of the semiconductor wafers W in the sonic bath 42 is most effective at or near the gas-liquid-interface 46. The position of each semiconductor wafer W relative to the constant level 48 of the gas-liquid-interface 46 and the simultaneous reciprocating and rotational motion of the wafer ensure that every portion of the wafer passes through the gas-liquid-interface during each complete rotation of the semiconductor wafer (i.e., as the wafer is rotated 360 degrees). Since the entire surface of the semiconductor wafer W passes through the gas-liquid-interface during each complete rotation of the wafer, every portion of the wafer is subjected to the most effective cleaning action for at least a fraction of the duration of such complete rotation. Preferably, rotation of the camming mechanism 62 rotates the semiconductor wafers W at a rate of at least approximately 8 rpm, and more preferably at a rate between approximately 12 and 18 rpm. The rotational rate of the semiconductor wafers W depends on the rotational speed of the driven axis 82, the outer diameter of the tubes 106, the distance between the axis X and the center of each rod 104, and the diameter of the semiconductor wafers. Because the camming mechanism 62 has two camming surfaces 108, each complete rotation of the camming mechanism results in two complete reciprocation cycles of the semiconductor wafers (i.e., the semiconductor wafers are moved up and down two times for every complete rotation of the camming mechanism). Preferably, the semiconductor wafers W are reciprocated up and down at a rate of at least approximately 20 cycles per minute, more preferably at a rate of at least 60 cycles per minute, and most preferably, at a rate of about 180 to 240 cycles per minute (i.e., twice the rotational speed of the camming mechanism). Subjected to these cleaning conditions, the semiconductor wafers are sufficiently cleaned in five to ten minutes. The rapid cleaning of the semiconductor wafers minimizes the exposure time to the ultrasonic energy and, therefore, minimizes ultrasonic damage to the wafers. The rapid cleaning also allows feedback information to be rapidly provided to the lapping operator so that any needed corrective adjustments to the lapping process can be timely made.

After the semiconductor wafers W are cleaned, the cassette 24 is lifted (either manually or via a robot arm) off the cassette receiving platform 60 and removed from the bath 42. Preferably, the cassette 24 is not fastened to the tank 22 or to the wafer moving mechanism 26 and no disconnection is necessary before removal of the cassette and semiconductor wafers W. Since the cassette 24 is not fastened to the tank or wafer moving mechanism, the cassette and wafers may be quickly and easily inserted in and removed from the bath. The weight of the cassette 24 is sufficient to keep the cassette stationary on the cassette receiving platform 60 as the semiconductor wafers W are reciprocated and rotated by the camming mechanism 62. Also, the camming mechanism 62 does not engage nor move the cassette 24. Thus, the semiconductor wafers W are reciprocated up and down and rotated independent of the cassette 24. Preferably, the reciprocation is sufficient to move the periphery of each semiconductor wafer W away from lower portions of the ribs 54 and the lower stringers 52 (FIG. 2) of the cassette 24 as the wafer is moved to its upper most position. Moving the wafer's periphery away from the ribs 54 and stringers 52 ensures that the ribs and stringers do not cause dead spots in the wafers (i.e., regions which are masked by the ribs and, therefore, not sufficiently cleaned).

Because the two camming surfaces 108 comprise spaced-portions of cylindric surfaces and not a single smooth continuous surface, the motion imparted to the semiconductor wafers W is somewhat bumpy which may result in some slipping between the camming surfaces and wafers. This slipping causes the rotational motion to be somewhat non-uniform which prevents marks which might otherwise occur if the motion would have a fixed pattern. Also, with this arrangement, orientation flats F of the semiconductor wafers W do not hinder rotation.

Figure 7:
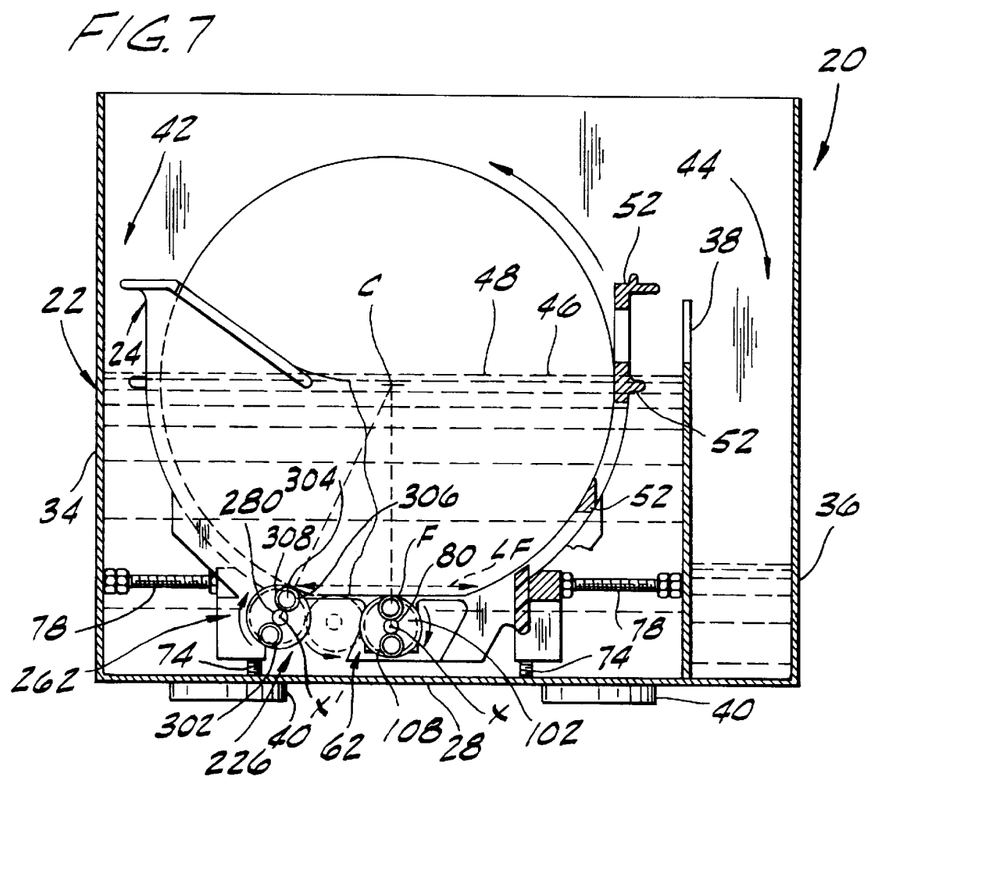
FIG. 7 is a sectional view of a semiconductor wafer cleaning apparatus of the present invention with portions broken away to show detail.
Figure 8:
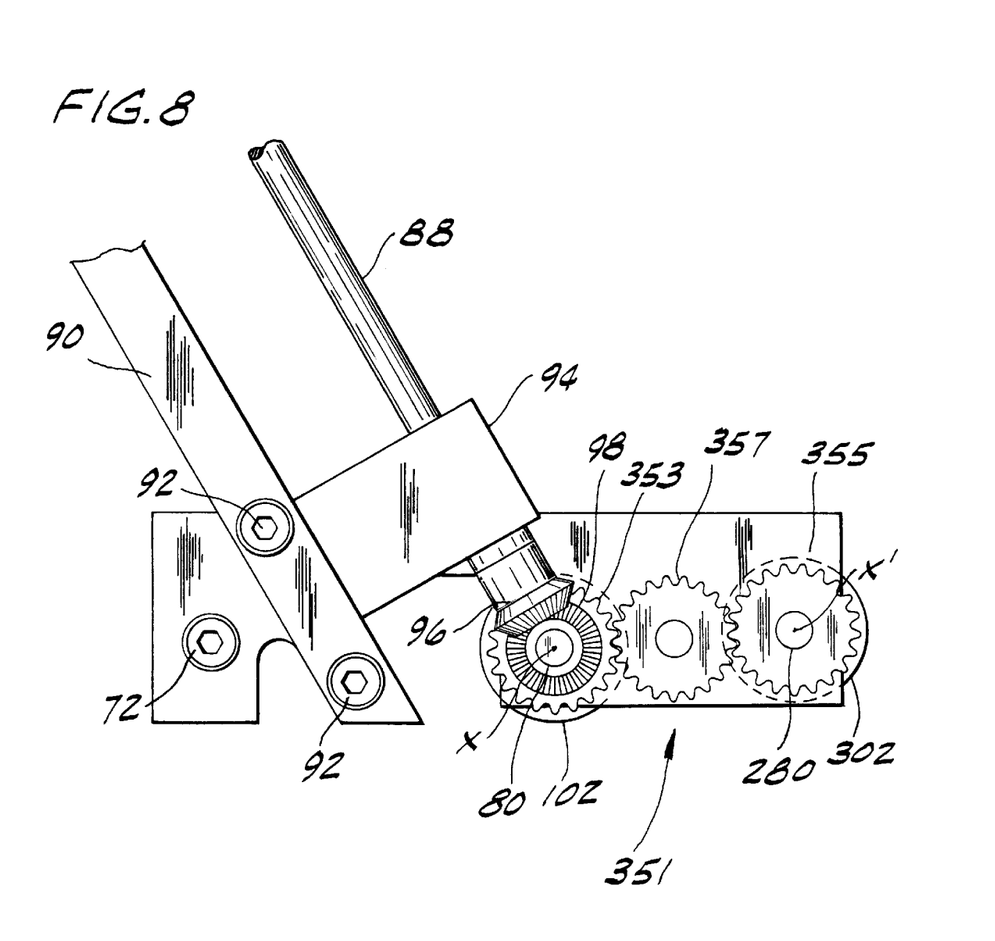
FIG. 8 is a partial rear elevational view of a wafer moving mechanism of the apparatus of FIG. 7.
Figure 9:
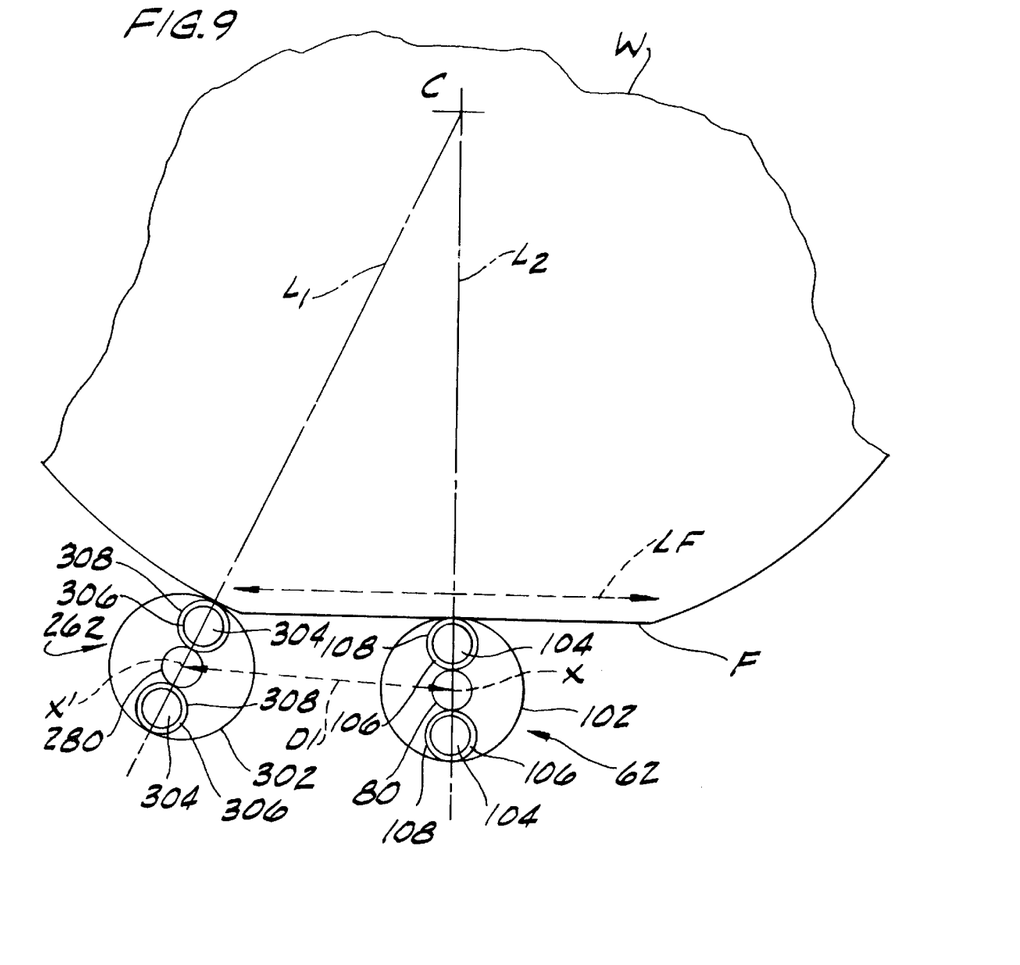
FIG. 9 is an enlarged schematic of a portion of the wafer cleaning apparatus of FIG. 7.

With reference to FIGS. 7–9, the semiconductor wafer cleaning apparatus of the present invention comprises a wafer-moving mechanism 226 similar to the prior art wafer-moving mechanism 26, and having a second camming mechanism, indicated generally as 262, to assist the first camming mechanism 62 in maintaining continuous movement of the wafer W relative to the cassette. The second camming mechanism 262 is useful when the wafer has a very smooth edge, such as produced by a fine edge grinding process, and particularly when the periphery of the wafer has an orientation discontinuity such as a flat F or notch (not shown). The second camming mechanism 262 is similar to the first camming mechanism 62 of the prior art, comprising a second driven shaft 280 extending along a generally horizontal axis X' between the front and rear members 64, 66 of the cassette receiving platform 60. Forward and rear disc-shaped blocks (of which only the rear block is shown and indicated as 302) are keyed to the ends of the second driven shaft 280 generally adjacent the forward and rear members, 64, 66, respectively, of the cassette receiving platform 60. Two rods 304 extend between the disc-shaped blocks 302 generally parallel to the second driven shaft 280 and into holes (not shown) in the blocks 302. Tubes 306 of a suitable elastomeric material (e.g., Tygon) surround the rods 304 and extend between the disc-shaped blocks 302. The outer surfaces of the tubes 306 constitute a second set of camming surfaces 308 engageable with the periphery of each semiconductor wafer W.

As seen best in FIG. 9, the axis of rotation X' of the second driven shaft 280 is substantially parallel to and spaced apart from the axis of rotation X of the first driven shaft 80. For illustrative purposes only, the distance D1 between the first and second axes of rotation X, X' for a 200 mm diameter semiconductor wafer is about 1.6 to 1.7 inches. This distance will vary depending on the size of the semiconductor wafers W being cleaned and the length of any orientation discontinuities in the wafer. However, in general, where an orientation flat F having a length LF is present on the periphery of the wafer W, the distance D1 between the rotation axes X, X' is preferably slightly greater than one-half the length of the flat. This permits the second camming surface 308 to engage a rounded portion of the periphery of the wafer W when the central area of the flat F is engaged by the first camming surface 108.

With reference to FIG. 8, a gear train, generally indicated at 351, drivingly connects the second driven shaft 280 to the first driven shaft 80. The gear train 351 comprises a first spur gear 353 keyed to the rear end 84 of the first driven shaft 80 generally adjacent the driven bevel gear 98 so that it rotates conjointly with the first driven shaft, a second spur gear 355 keyed to a rear end 284 of the second driven shaft, and a third or intermediate spur gear 357 interconnecting the first and second gears. Interconnecting the driven shafts 80, 280 using the intermediate spur gear 357 allows the shafts to be powered by the single motor 86. Rotation of the first spur gear 353 effects a counter-rotation of the intermediate spur gear 357 with respect to the first driven shaft 80, which in turn rotates the second spur gear 355, keyed to the second driven shaft 280, in the same direction as the as the first driven shaft. As such, the first and second camming surfaces 108, 308 rotate about the respective axes of rotation X, X' in the same direction.

As shown in FIG. 9, the second camming surfaces 308 are oriented so as to engage the periphery of the semiconductor wafer W simultaneously with the first camming surfaces 108. As such, the first and second camming surfaces 108, 308 are arranged with respect to each other so that when the camming surfaces engage the periphery of the wafer W, respective imaginary lines L1, L2 drawn through the center C of the wafer W and a respective axis of rotation X, X' pass through the centers of the rods 104, 304 which are covered by the tubes 106, 306 defining the camming surfaces 108, 308 that engage the periphery of the wafer W. These imaginary lines L1, L2 are each perpendicular to the tangent of the wafer W at the point of engagement between the camming surfaces 108, 308 and the wafer. However, the orientation of the camming surfaces 108, 308 may be such that engagement of the second camming surface with the periphery of the wafer W is out of phase with the engagement of the first camming surface with the wafer without departing from the scope of this invention.

Operation of the apparatus of the present invention is similar to that described above with respect to the prior art apparatus. However, when a semiconductor wafer W having a very smooth periphery, such as formed by fine edge grinding, is placed in the cassette 24 for cleaning, the first and second camming surfaces 108, 308 work together to maintain continuous rotation of the wafer through its cleaning cycle. Where the wafer includes an orientation flat F, the first camming surface 108 tends to slip along the flat edge of the wafer as the central area of the flat moves directly over the first axis of rotation X. Because the second axis of rotation X' is spaced apart from the first axis of rotation X, the second camming surface 308 simultaneously engages a rounded portion of the periphery of the wafer W to assist the first camming surface 108 in rotating the wafer.

The wafer moving mechanism 226 of the present invention has been described as rotating and reciprocating semiconductor wafers in a bath for cleaning semiconductor wafers. However, it is to be understood that the mechanism may alternatively be used to rotate and reciprocate wafers in another type of cleaning process, an etching process or other semiconductor wafer shaping process.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for cleaning semiconductor wafers, each wafer having a generally circular periphery but including an orientation discontinuity for orienting the wafer, the orientation discontinuity having a length, said apparatus comprising:

a tank for containing a liquid, said liquid having an upper surface;

a wafer holder for holding the semiconductor wafer in the tank with at least a portion of the semiconductor wafer being immersed in the liquid within the tank; and a wafer-moving mechanism constructed for engaging the semiconductor wafer in the tank to rotate the semiconductor wafer and to reciprocate the semiconductor wafer so that at least a central region of the wafer repeatedly passes through the surface of the liquid, said wafer-moving mechanism comprising first and second surfaces engageable with the semiconductor wafer and rotatable about respective first and second axes of rotation for rotating the wafer;

the second surface being spaced apart from the first surface so that the first and second surfaces are engageable with the wafer at spaced apart locations on the periphery of the wafer;

the second surface being spaced apart from the first surface a distance selected so that when the first surface engages the orientation discontinuity the second surface engages a circular portion of the periphery of the wafer.

2. Apparatus as set forth in claim 1 wherein the distance between the first surface and the second surface is greater than about one-half of the length of the orientation discontinuity.

3. Apparatus as set forth in claim 2 wherein the first surface comprises a first camming surface for reciprocating the semiconductor wafer as the first surface rotates.

4. Apparatus as set forth in claim 3 wherein said semiconductor wafer is positioned within the tank in a generally upright position, said first camming surface being engageable with a bottom portion of the periphery of the semiconductor wafer to impart a generally up and down reciprocating movement of the semiconductor wafer.

5. Apparatus as set forth in claim 3 wherein said second surface comprises a second camming surface for reciprocating the semiconductor wafer as the second surface rotates.

6. Apparatus as set forth in claim 5 wherein the second camming surface rotates about the second axis of rotation in the same direction that the first camming surface rotates about the first axis of rotation.

7. Apparatus as set forth in claim 6 wherein rotation of the first and second camming surfaces causes the semiconductor wafer to counter-rotate relative to the rotation of the camming surfaces.

8. Apparatus as set forth in claim 5 wherein the camming surfaces are constructed for rotating and reciprocating the semiconductor wafer relative to the wafer holder.

9. Apparatus as set forth in claim 5 wherein said first camming surface comprises a surface portion of a first pair of cylinders eccentrically rotated about said first axis of rotation, said second camming surface comprising a surface portion of a second pair of cylinders eccentrically rotated about said second axis of rotation.

10. Apparatus as set forth in claim 1 wherein the distance between the first and second surfaces is less than the length of the orientation discontinuity of the wafer.

11. Apparatus for cleaning semiconductor wafers, said apparatus comprising:

a tank for containing a liquid, said liquid having an upper surface;

a wafer holder for holding the semiconductor wafer in the tank with at least a portion of the semiconductor wafer being immersed in the liquid within the tank; and a wafer-moving mechanism constructed for engaging the semiconductor wafer in the tank to rotate the semiconductor wafer and to reciprocate the semiconductor wafer so that at least a central region of the wafer repeatedly passes through the surface of the liquid, said wafer-moving mechanism comprising first and second surfaces engageable with the semiconductor wafer and rotatable about respective first and second axes of rotation for rotating the wafer;

the second axis of rotation being spaced apart from the first axis of rotation so that the first and second surfaces are engageable with the wafer at spaced apart locations on the periphery of the wafer;

the spacing between the first and second axes being such that an angle defined by respective imaginary lines drawn from the center of the wafer to the respective first and second axes is substantially less than 90°.

12. Apparatus as set forth in claim 11 wherein the first and second surfaces are of an elastomeric material to frictionally engage the periphery of the semiconductor wafer.

13. Apparatus as set forth in claim 12 wherein said first and second surfaces are adapted to concurrently engage the periphery of the semiconductor wafer.

\* \* \* \* \*